US011495607B2

(12) United States Patent
Wen et al.

(10) Patent No.: US 11,495,607 B2
(45) Date of Patent: Nov. 8, 2022

(54) LOW-TEMPERATURE PASSIVATION OF FERROELECTRIC INTEGRATED CIRCUITS FOR ENHANCED POLARIZATION PERFORMANCE

(71) Applicant: TEXAS INSTRUMENTS INCORPORATED, Dallas, TX (US)

(72) Inventors: Huang-Chun Wen, Dallas, TX (US); Richard Allen Bailey, Richardson, TX (US); Antonio Guillermo Acosta, Richardson, TX (US); John A. Rodriguez, Dallas, TX (US); Scott Robert Summerfelt, Garland, TX (US); Kemal Tamer San, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/056,827

(22) Filed: Aug. 7, 2018

(65) Prior Publication Data
US 2018/0374861 A1 Dec. 27, 2018

Related U.S. Application Data

(62) Division of application No. 14/728,683, filed on Jun. 2, 2015, now abandoned.
(Continued)

(51) Int. Cl.
*H01L 27/11507* (2017.01)
*H01L 21/02* (2006.01)
(Continued)

(52) U.S. Cl.
CPC .... *H01L 27/11507* (2013.01); *H01L 21/0217* (2013.01); *H01L 21/02118* (2013.01);
(Continued)

(58) Field of Classification Search
None
See application file for complete search history.

(56) References Cited

U.S. PATENT DOCUMENTS 4,149,302 A * 4/1979 Cook ................ H01L 27/11502
257/295
4,253,029 A * 2/1981 Lepselter .................. G03F 1/22
216/12
(Continued)

FOREIGN PATENT DOCUMENTS

CN 1215914 A 5/1999
EP 0669655 A2 8/1995
(Continued)

OTHER PUBLICATIONS

CNIPA Search Report dated Dec. 10, 2018.
(Continued)

*Primary Examiner* — Bo B Jang
(74) *Attorney, Agent, or Firm* — Andrew R. Ralston; Charles A. Brill; Frank D. Cimino

(57) ABSTRACT

Curing of a passivation layer applied to the surface of a ferroelectric integrated circuit so as to enhance the polarization characteristics of the ferroelectric structures. A passivation layer, such as a polyimide, is applied to the surface of the ferroelectric integrated circuit after fabrication of the active devices. The passivation layer is cured by exposure to a high temperature, below the Curie temperature of the ferroelectric material, for a short duration such as on the order of ten minutes. Variable frequency microwave energy may be used to effect such curing. The cured passivation layer attains a tensile stress state, and as a result imparts a compressive stress upon the underlying ferroelectric material. Polarization may be further enhanced by polarizing the ferroelectric material prior to the cure process.

20 Claims, 6 Drawing Sheets

Related U.S. Application Data

(60) Provisional application No. 62/053,540, filed on Sep. 22, 2014.

(51) Int. Cl.
   *H01L 23/31* (2006.01)
   *H01L 21/56* (2006.01)
   *H01L 23/00* (2006.01)

(52) U.S. Cl.
   CPC .. *H01L 21/02197* (2013.01); *H01L 21/02318* (2013.01); *H01L 21/56* (2013.01); *H01L 23/3192* (2013.01); *H01L 23/562* (2013.01); *H01L 24/02* (2013.01); H01L 23/3114 (2013.01); H01L 24/03 (2013.01); H01L 24/05 (2013.01); H01L 24/11 (2013.01); H01L 24/13 (2013.01); H01L 2224/024 (2013.01); H01L 2224/0401 (2013.01); H01L 2224/05569 (2013.01); H01L 2224/131 (2013.01); H01L 2224/13024 (2013.01); H01L 2924/07025 (2013.01)

(56) References Cited

U.S. PATENT DOCUMENTS

| | | | |
|---|---|---|---|
| 5,280,184 A * | 1/1994 | Jokerst | H01L 21/2007 257/443 |
| 5,401,983 A * | 3/1995 | Jokerst | H01L 21/2007 257/443 |
| 5,465,009 A * | 11/1995 | Drabik | H01L 24/96 257/723 |
| 5,525,528 A * | 6/1996 | Perino | H01L 27/11507 438/3 |
| 5,738,915 A * | 4/1998 | Fathi | B05D 3/029 427/487 |
| 5,795,794 A * | 8/1998 | Nagano | H01L 28/55 257/E21.009 |
| 5,868,949 A * | 2/1999 | Sotokawa | H01L 23/49894 216/18 |
| 5,879,756 A | 3/1999 | Fathi et al. | |
| 5,986,335 A * | 11/1999 | Amagai | H01L 23/4951 257/666 |
| 6,177,286 B1 * | 1/2001 | Chidambarrao | H01L 21/76801 257/E21.252 |
| 6,238,933 B1 | 5/2001 | Sun | |
| 6,368,909 B2 * | 4/2002 | Koo | H01L 27/1085 438/240 |
| 6,617,690 B1 * | 9/2003 | Gates | H01L 23/5329 257/736 |
| 6,656,748 B2 * | 12/2003 | Hall | H01L 21/31122 438/3 |
| 6,730,354 B2 * | 5/2004 | Gilbert | C23C 16/409 427/255.32 |
| 6,953,950 B2 * | 10/2005 | Sashida | H01L 21/0214 257/204 |
| 7,128,843 B2 * | 10/2006 | Mehta | B81C 1/00158 216/2 |
| 7,241,656 B2 * | 7/2007 | Cross | G11C 11/22 257/E21.009 |
| 7,285,460 B2 * | 10/2007 | Sashida | H01L 21/0214 257/E21.008 |
| 7,476,921 B2 * | 1/2009 | Sashida | H01L 21/0214 257/295 |
| 7,781,284 B2 * | 8/2010 | Sashida | H01L 21/0214 257/295 |
| 7,939,456 B2 * | 5/2011 | Ahmad | H05B 6/806 219/702 |
| 8,299,580 B2 * | 10/2012 | Kumakawa | B28D 5/0011 257/620 |
| 8,299,615 B2 * | 10/2012 | Fayaz | H01L 21/76801 257/758 |
| 8,416,598 B2 * | 4/2013 | Summerfelt | G11C 29/50 365/145 |
| 8,441,833 B2 * | 5/2013 | Summerfelt | G11C 29/50 365/145 |
| 8,472,236 B2 * | 6/2013 | Summerfelt | G11C 29/50 365/145 |
| 8,778,774 B2 * | 7/2014 | Nishida | H01L 27/11502 117/94 |
| 8,918,988 B2 * | 12/2014 | Fayaz | H01L 21/76801 257/775 |
| 8,962,350 B2 * | 2/2015 | Srinivasan | H01L 21/022 257/295 |
| 9,221,954 B2 * | 12/2015 | Jung | C08J 5/18 |
| 9,548,200 B2 * | 1/2017 | Wong | C23C 16/511 |
| 9,960,035 B2 * | 5/2018 | Wong | H01L 21/02345 |
| 10,629,430 B2 * | 4/2020 | Wong | C23C 14/22 |
| 2001/0023080 A1 * | 9/2001 | Koo | H01L 27/1085 438/3 |
| 2002/0000588 A1 | 1/2002 | Judai | |
| 2002/0000659 A1 * | 1/2002 | Toyosawa | H01L 23/5329 257/751 |
| 2002/0056861 A1 | 5/2002 | Nagano et al. | |
| 2003/0146287 A1 * | 8/2003 | Maruyama | G06K 19/07372 235/492 |
| 2003/0234459 A1 * | 12/2003 | Nandu | B29C 35/0288 264/1.36 |
| 2004/0046185 A1 * | 3/2004 | Sashida | H01L 21/0214 257/200 |
| 2004/0197526 A1 * | 10/2004 | Mehta | B81C 1/00158 428/156 |
| 2004/0197528 A1 | 10/2004 | Mehta | |
| 2005/0073009 A1 * | 4/2005 | Kojima | H01L 27/0266 257/362 |
| 2006/0001026 A1 * | 1/2006 | Sashida | H01L 21/0214 257/69 |
| 2006/0001028 A1 | 1/2006 | Sashida | |
| 2006/0196843 A1 * | 9/2006 | Mehta | B81C 1/00158 216/2 |
| 2006/0211156 A1 * | 9/2006 | Cross | G11C 11/22 438/3 |
| 2007/0045595 A1 * | 3/2007 | Kondo | H01L 27/11502 252/500 |
| 2007/0228561 A1 | 10/2007 | Matsuki et al. | |
| 2008/0054402 A1 * | 3/2008 | Sashida | H01L 21/0214 257/535 |
| 2008/0265254 A1 * | 10/2008 | Nishiura | G02F 1/136213 257/59 |
| 2008/0277705 A1 | 11/2008 | Takahashi | |
| 2009/0127657 A1 * | 5/2009 | Sashida | H01L 21/0214 257/532 |
| 2009/0155931 A1 * | 6/2009 | Ma | C30B 23/02 438/3 |
| 2010/0140743 A1 | 6/2010 | Sashida | |
| 2010/0148315 A1 * | 6/2010 | Kumakawa | B28D 5/0011 257/620 |
| 2010/0296329 A1 * | 11/2010 | Summerfelt | G11C 11/22 365/145 |
| 2010/0298329 A1 | 11/2010 | Summerfalt et al. | |
| 2011/0049723 A1 * | 3/2011 | Fayaz | H01L 21/76801 257/773 |
| 2011/0076787 A1 * | 3/2011 | Ahmad | H01L 21/67248 438/5 |
| 2011/0311796 A1 * | 12/2011 | Jung | C08J 5/18 428/220 |
| 2012/0195096 A1 * | 8/2012 | Summerfelt | G11C 11/22 365/145 |
| 2012/0211884 A1 * | 8/2012 | Stepniak | H01L 23/3114 257/737 |
| 2012/0329265 A1 * | 12/2012 | Fayaz | H01L 21/76801 438/614 |
| 2013/0021833 A1 * | 1/2013 | Summerfelt | G11C 11/22 365/145 |
| 2013/0056811 A1 * | 3/2013 | Lin | H01L 27/11507 257/295 |
| 2013/0078742 A1 * | 3/2013 | Nishida | H01L 41/257 438/3 |

(56) References Cited

U.S. PATENT DOCUMENTS

| | | | | |
|---|---|---|---|---|
| 2013/0160548 | A1* | 6/2013 | Ishida | G01P 15/097 |
| | | | | 73/514.29 |
| 2013/0299953 | A1* | 11/2013 | Hubbard | H01L 21/02345 |
| | | | | 257/643 |
| 2013/0302917 | A1* | 11/2013 | Ahmad | H01L 21/56 |
| | | | | 438/7 |
| 2014/0103030 | A1* | 4/2014 | Ahmad | H05B 6/6482 |
| | | | | 219/680 |
| 2014/0117535 | A1* | 5/2014 | Daubenspeck | H01L 23/3114 |
| | | | | 257/737 |
| 2014/0147940 | A1 | 5/2014 | Visokay | |
| 2014/0284821 | A1* | 9/2014 | Hubbard | H01L 23/293 |
| | | | | 257/792 |
| 2015/0056819 | A1* | 2/2015 | Wong | H01L 21/02345 |
| | | | | 438/781 |
| 2015/0235955 | A1 | 8/2015 | Kudo et al. | |
| 2016/0086960 | A1* | 3/2016 | Wen | H01L 27/11507 |
| | | | | 257/295 |
| 2017/0117146 | A1* | 4/2017 | Wong | H01L 21/0234 |
| 2017/0365490 | A1* | 12/2017 | Ow | H05B 6/68 |
| 2018/0240666 | A1* | 8/2018 | Wong | H01L 21/67115 |
| 2018/0374861 | A1* | 12/2018 | Wen | H01L 27/11507 |

FOREIGN PATENT DOCUMENTS

| | | |
|---|---|---|
| JP | 02186669 | 7/1990 |
| JP | 2004087754 | 3/2004 |
| JP | 2004095861 | 3/2004 |
| JP | 2007273676 | 10/2007 |
| JP | 2014069662 | 4/2014 |
| WO | 201469662 | 5/2014 |

OTHER PUBLICATIONS

D. E. Fisch, et al., "Analysis of Thin Film Ferroelectric Aging", International Reliability Physics Symposium (IEEE, 1990), pp. 237-242.

Muhib M. Khan, et al., "Stress Relief in Plastic-Encapsulated. Integrated Circuit Devices by Die Coating with Photodefinable Polyimide", Proceedings of the 38th Electronics Components Conference (IEEE, 1988), pp. 425-431.

David Patten, et al., "Elimination of Polyimide Stress Buffer on Integrated Circuits Using Advanced Packaging Materials", SEMI Technology Symposium: International Electronics Manufacturing Technology Symposium (IEEE, 2002), pp. 195-199.

Craig Schuckert, et al., "Polyimide Stress Buffers in IC Technology", Advanced Semiconductor Manufacturing Conference (IEEE, 1990), pp. 72-74.

Fong-Cheng Tai, et al.: "Spin Coating Polyimide Film on Hydrogenated DLC Film Surface Prepared by Ion Beam Deposition Method," Materials Transactions, vol. 47, No. 7, Jan. 1, 2006, pp. 1869-1873, XP055510461.

European Search Report dated Oct. 25, 2018.

* cited by examiner

LOW-TEMPERATURE PASSIVATION OF FERROELECTRIC INTEGRATED CIRCUITS FOR ENHANCED POLARIZATION PERFORMANCE

CROSS-REFERENCE TO RELATED APPLICATIONS

This application is a divisional of and claims priority, under 35 U.S.C. § 119(e), of application Ser. No. 14/728, 653, filed Jun. 2, 2015, which claims priority of Provisional Application No. 62/053,540, filed Sep. 22, 2014, the contents of which are herein incorporated by this reference.

STATEMENT REGARDING FEDERALLY SPONSORED RESEARCH OR DEVELOPMENT

Not applicable.

BACKGROUND OF THE INVENTION

This invention is in the field of integrated circuit manufacture. Embodiments of this invention are more specifically directed to the formation of capacitors in memory devices such as ferroelectric memories.

A recently developed technology for realizing non-volatile solid-state memory devices involves the construction of capacitors in which the dielectric material is a polarizable ferroelectric material, such as lead-zirconium-titanate (PZT) or strontium-bismuth-tantalate (SBT), rather than silicon dioxide or silicon nitride as typically used in non-ferroelectric capacitors. Hysteresis in the charge-vs-voltage (Q-V) characteristic of the ferroelectric material, based on its polarization state, enables the non-volatile storage of binary states in those capacitors. In contrast, conventional MOS capacitors lose their stored charge on power-down of the device.

Non-volatile solid-state read/write random access memory (RAM) devices based on ferroelectric capacitors, such memory devices commonly referred to as "ferroelectric RAM", or "FeRAM", or "FRAM" devices, have been implemented in many electronic systems, particularly portable electronic devices and systems. FRAMs are especially attractive in implantable medical devices, such as pacemakers and defibrillators. Various memory cell architectures including ferroelectric capacitors are known in the art, including the well-known 1T1C (one transistor, two transistor) and 2T2C (two transistor, two capacitor) cells, among others. Ferroelectric capacitors are also implemented in some integrated circuits as programmable analog capacitors.

FIG. 1a illustrates the construction of an example of a portion of an integrated circuit including conventional 1T1C ferroelectric random access memory (FRAM) cell 6. In this example, cell 6 includes ferroelectric capacitor 2 and metal-oxide-semiconductor (MOS) transistor 5, where one plate of capacitor 2 is connected to one end of the source/drain path of transistor 5. Capacitor 2 and transistor 5 are both disposed at or near a semiconducting surface of a semiconductor substrate; alternatively, capacitor 2 and transistor 5 may instead be formed at the surface of a semiconductor layer that overlies an insulator layer, such as according to a silicon-on-insulator (SOI) technology as known in the art. N-channel MOS transistor 5 in the example of FIG. 1a includes n-type source/drain regions 14 at the surface of p-type substrate 10 (or of a p-type "well" formed into substrate 10, as the case may be), with gate electrode 16 overlying a channel region between source/drain regions 14, and separated from that channel region by gate dielectric 17, as conventional. Isolation dielectric structures 15 are disposed at or near the surface of substrate 10 to isolate transistors from one another, in the conventional manner for MOS integrated circuits. Interlevel dielectric 13 is disposed over transistor 5, with conductive plug 18 disposed in a contact opening through interlevel dielectric 13 to provide a conductive connection between one of source/drain regions 14 of transistor 5 and lower plate 20a of ferroelectric capacitor 2. Gate electrode 16 corresponds to the word line of cell 6, while the one of source/drain regions 14 not in contact with conductive plug 18 corresponds to the bit line of the column in which cell 6 resides.

In the example of FIG. 1a, ferroelectric capacitor 2 is formed of a ferroelectric "sandwich" stack of conductive plates 20a, 20b, between which ferroelectric material 22 is disposed. Lower conductive plate 20a is formed at a location overlying conductive plug 18, so as to be in electrical contact with the underlying source/drain region 14 of transistor 5 by way of that conductive plug 18; upper conductive plate 20b will receive a plate line voltage during operation of cell 6, as will be described below. Lower conductive plate 20a and upper plate 20b are formed from one or more layers of conductive metals, metal oxides, and the like. A typical construction of lower conductive plate 20a is a stack of a diffusion barrier layer in contact with conductive plug 18 and a layer of a noble metal (e.g., Ru, Pt, h, Rh, Pt, Pd, Au) or metal oxide (e.g., RuOx, IrOx, PdOx, $SrRuO_3$) overlying the barrier layer and in contact with the ferroelectric material 22. Conductive plates 20a, 20b are typically formed of the same conductive material or materials as one another, for purposes of symmetry, simplicity of the manufacturing flow, and improved ferroelectric polarization performance. As mentioned above, ferroelectric material 22 in capacitor 2 is typically lead-zirconium-titanate (PZT) or strontium-bismuth-tantalate (SBT), either of which may be deposited by way of metalorganic chemical vapor deposition. Ferroelectric material 22 is desirably as thin as practicable, for purposes of electrical performance (e.g., polarization), and for consistency with the deep sub-micron features used to realize modern integrated circuits.

FIG. 1b illustrates an example of a Q-V characteristic of a conventional ferroelectric capacitor such as capacitor 2 of FIG. 1a. As shown, the charge (Q) stored across the conductive plates depends on both the voltage currently applied to the plates (V) and the recent history of that voltage. In this example, capacitor 2 is polarized into the "+1" state by application of a voltage V exceeding a "coercive" voltage $+V_\alpha$ across the capacitor plates (conductive plates 20a, 20b). Once polarized to the "+1" state, capacitor 2 will exhibit a stored charge of $+Q_1$ so long as voltage V remains above coercive voltage $-V_\beta$. Conversely, if the voltage V applied across the capacitor plates is more negative than coercive voltage $-V_\beta$, capacitor 2 is polarized into the "−1" state, and will exhibit a stored charge of $-Q_2$ for an applied voltage V below $+V_\alpha$.

An important characteristic of ferroelectric capacitors, for purposes of non-volatile storage in integrated circuits, is the difference in capacitances exhibited by a ferroelectric capacitor in its respective polarized states. As fundamental in the art, capacitance is the ratio of stored charge to applied voltage. Ferroelectric capacitors exhibit both a linear capacitance by virtue of its parallel plate construction, and also a significant polarization capacitance by virtue of its response to changes in polarization state upon application of a polarizing voltage. For example, referring to FIG. 1b, the polarization of a ferroelectric capacitor from its "−1" state to its "+1" state by an applied voltage above coercive voltage $V_\alpha$ is reflected by a relatively high capacitance $C(-1)$ corresponding to the polarization charge stored in the capacitor due to its change of polarization state. The differential charge stored as a result of the polarization of the capacitor from one state to the opposite state is commonly referred to as the "switching polarization". On the other hand, a capacitor that already in its "+1" state exhibits little capacitance $C(+1)$ from re-polarization to the "−1" state, because its ferroelectric domains are already aligned in the direction of the applied coercive voltage and thus little additional polarization charge is stored. Accordingly, the polarization state of a ferroelectric memory cell (i.e., the stored data state) is conventionally read by application of a coercive voltage to the ferroelectric capacitor and sensing the exhibited capacitance.

FIGS. 1c and 1d illustrate a read operation of an instance of FRAM cell $6_{jk}$, which resides in column j and row k of an FRAM memory array. In this conventional approach, a read is performed by applying a low voltage $V_{ss}$ to bit line $BL_k$, then isolating bit line $BL_k$ to leave it floating, and then raising the voltage of plate line PL from the low voltage $V_{ss}$ to a high voltage $V_{cc}$ above the coercive voltage $+V_\alpha$ of capacitor 2 while word line $WL_j$ is energized to turn on transistor 5. The high plate line voltage interrogates the polarization capacitance of capacitor 2 according to the hysteresis diagram of FIG. 1a, producing a read current $i_R$ through transistor 5 to bit line $BL_k$. Sense amplifier 8, coupled to bit line $BL_k$, senses the voltage $V_{BL}$ established at the (typically parasitic) capacitance BLC of bit line $BL_k$ by read current $i_R$ to discern the stored data state. As shown in FIG. 1d, if capacitor 2 of cell $6_{jk}$ was previously in the "+1" polarization state, the relatively low read current $i_R$ will establish a relatively low level ($<V_{REF}$) voltage transition V(0) that will be interpreted by sense amplifier 8 as a "0" data state. Conversely, if capacitor 2 of cell $6_{jk}$ was previously in the "−1" polarization state, the stronger read current $i_R$ will establish a relatively high level ($>V_{REF}$) voltage transition V(1) that will be interpreted by sense amplifier 8 as a "1" data state. The "read margin" of cell $6_{jk}$ corresponds to the difference in the levels of read current $i_R$, and the corresponding difference in bit line voltage $V_{BL}$ relative to reference voltage $V_{REF}$, established by the two polarization states of capacitor 2 in cell $6_{jk}$.

As known in the art, ferroelectric capacitors and thus memories incorporating such devices are vulnerable over time to weakening of the switching polarization, commonly referred to as "aging". This weakening corresponds to collapse of the polarization hysteresis loop, for example as shown by curves 3+, 3− of FIG. 1b. In the memory context, this weakened switching polarization will appear as a loss of read margin and a corresponding increased likelihood of read errors.

It has been observed that exposure of ferroelectric integrated circuits to high temperatures such as those encountered in manufacturing processes following the deposition of the ferroelectric material, will degrade the polarization characteristics of that material. Examples of such high temperature processes include those involved in forming metal conductor levels in the integrated circuit itself, packaging of the integrated circuit (e.g., thermal curing of plastic mold compound), assembling the packaged device into its system application (e.g., solder reflow), and also operating the device at elevated temperatures. Extended or repeated exposure to temperature will degrade the ability of the material to fully repolarize, typically due to hydrogen diffusing into the ferroelectric material. Accordingly, it is useful to minimize exposure of the integrated circuit to high temperatures subsequent to ferroelectric deposition.

By way of further background, packaging of the integrated circuit can also result in mechanical stresses applied to the surface of the die, with such stresses being sufficient in some cases as to cause cracking of the protective overcoat film at the die or even displacement of metal conductors or other features so as to cause device failure. These stresses can be especially severe in the case of packages of the type in which a cured plastic mold compound encapsulates the integrated circuit die. Various approaches for reducing the mechanical stresses caused by packaging are known in the art. One approach is the application of a stress relief layer, such as an organic film or coating, to the surface of the integrated circuit die prior to molding. The use of a polyimide film as this stress relief layer is widespread in the art, due to its compatibility with photolithographic patterning and etching to expose the bond pads of the die and its other favorable thermal and mechanical properties. According to conventional processing techniques, the formation of the polyimide film involves a final bake process to cure the material. This final bake is typically performed at an elevated temperature for a significant duration, for example at 375° C. for one hour. However, as discussed above, thermal processes following the fabrication of ferroelectric elements, such as ferroelectric capacitors, tend to degrade the switching polarization characteristics of the material and thus such performance parameters as read margin in FRAM applications. As such, the conventional bake used to cure the polyimide stress relief film tends to degrade the ferroelectric material. Use of the polyimide stress relief film as applied in the conventional manner is thus discouraged for ferroelectric integrated circuits.

By way of further background, the packaging of integrated circuits into die-size packages referred to in the art as wafer-chip-scale packages ("WCSP"), has become popular in the art. According to this approach, for example as described in U.S. Patent Application Publication No. US 2012/0211884 A1, published Aug. 23, 2012, commonly assigned herewith and incorporated herein by this reference, the WCSP eliminates encapsulation of the integrated circuit die with mold compound or the like, instead forming solder balls or "bumps" onto conductive pads at the surface of the integrated circuit. Passivation layers, typically formed of a polyimide, are formed over the integrated circuit to define the locations of the conductive pads, and in some cases to also insulate an additional patterned conductive layer (i.e., a redistribution layer, or "RDL") that routes signals from the solder balls to the bond pads of the integrated circuit die. A WCSP is mounted to a printed circuit board by placing it upside-down, with the solder balls at corresponding lands on the circuit board; a solder reflow will then attach the package to the printed circuit board via the reflowed solder balls.

As discussed above, the conventional polyimide cure processes involved in WCSP technology will degrade the switching polarization characteristics of ferroelectric material, especially if multiple passivation layers are necessary because an RDL is required. This degradation in polarization, and in read margin in the FRAM context, can be sufficiently severe that the device cannot tolerate the additional degradation that will occur from the subsequent solder reflow process. Accordingly, WCSP technology has not been available for integrated circuits, such as FRAMs, that include ferroelectric structures.

By way of further background, U.S. Pat. No. 8,778,774, which is incorporated herein by this reference, describes the application of external mechanical stress to a semiconductor wafer to increase the polarization of ferroelectric devices in integrated circuits on that wafer.

BRIEF SUMMARY OF THE INVENTION

Disclosed embodiments provide a method of fabricating a ferroelectric integrated circuit and the integrated circuit so fabricated in which the polarization characteristics of the ferroelectric material are enhanced.

Disclosed embodiments provide such a method and integrated circuit that can tolerate subsequent thermal processes.

Disclosed embodiments provide such a method and integrated circuit that provides improved read margin for ferroelectric memories.

Disclosed embodiments provide such a method and integrated circuit in which the polarization characteristics are enhanced without requiring modification of processes involved in forming the ferroelectric structure.

Disclosed embodiments provide such a method and integrated circuit that can be packaged by way of wafer-chip-scale package (WCSP) technology.

Other objects and advantages of the disclosed embodiments will be apparent to those of ordinary skill in the art having reference to the following specification together with its drawings.

According to certain embodiments, a passivation material is applied to the surface of a ferroelectric integrated circuit die, and is cured to a tensile stress state that imparts compressive stress to the underlying ferroelectric material. In one embodiment, the passivation material is a polyimide film that is cured by a thermal process with fast temperature ramp that heats the film to a temperature below the Curie temperature of the ferroelectric material for a short time period.

DETAILED DESCRIPTION OF THE INVENTION

Figure 1A:
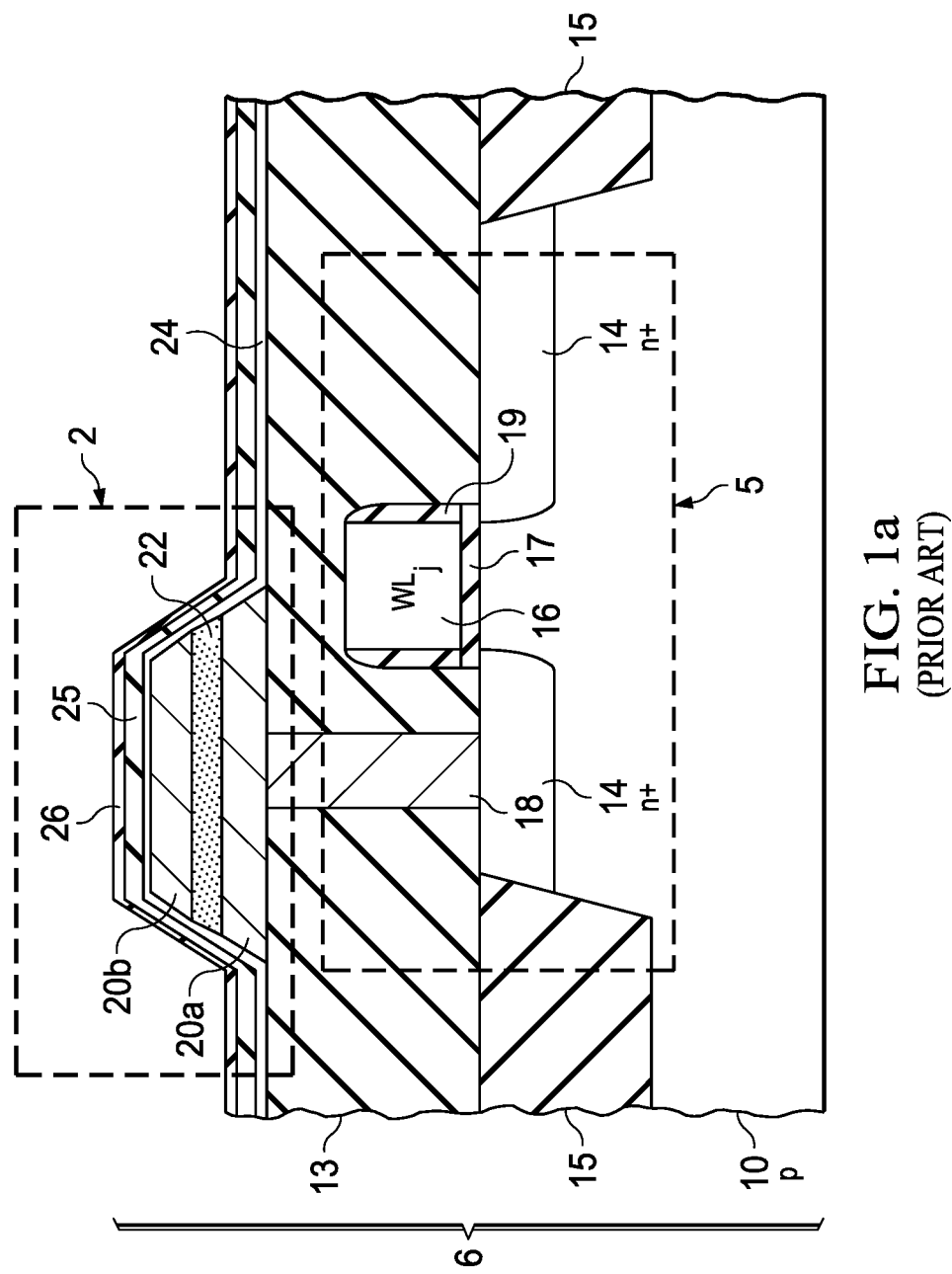
FIG. 1a is a cross-sectional view illustrating a portion of an integrated circuit including a ferroelectric capacitor constructed according to conventional methods.
Figure 1B:
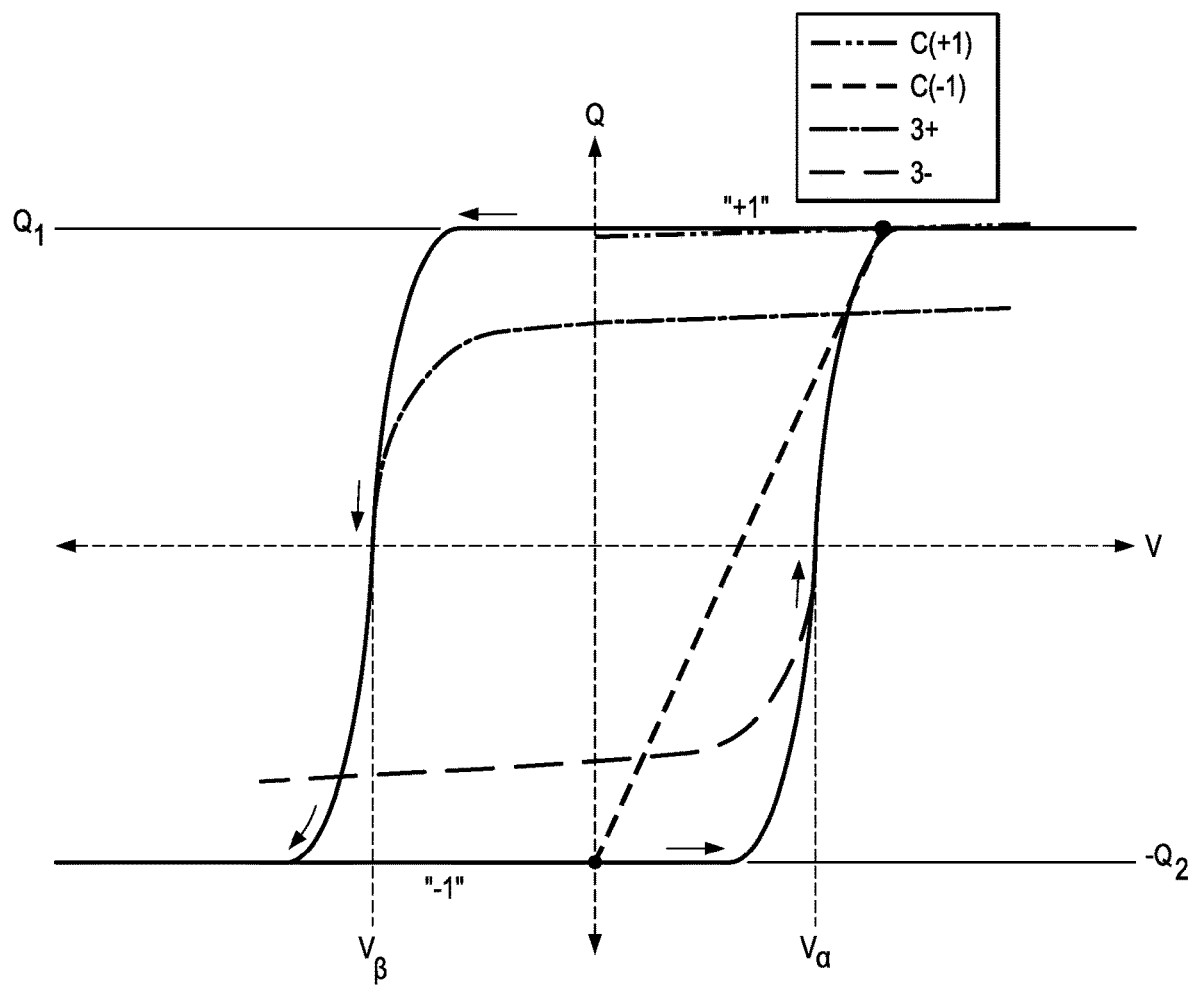
FIG. 1b is a plot of a charge-vs.-voltage characteristic of a conventional ferroelectric capacitor.
Figure 1C:
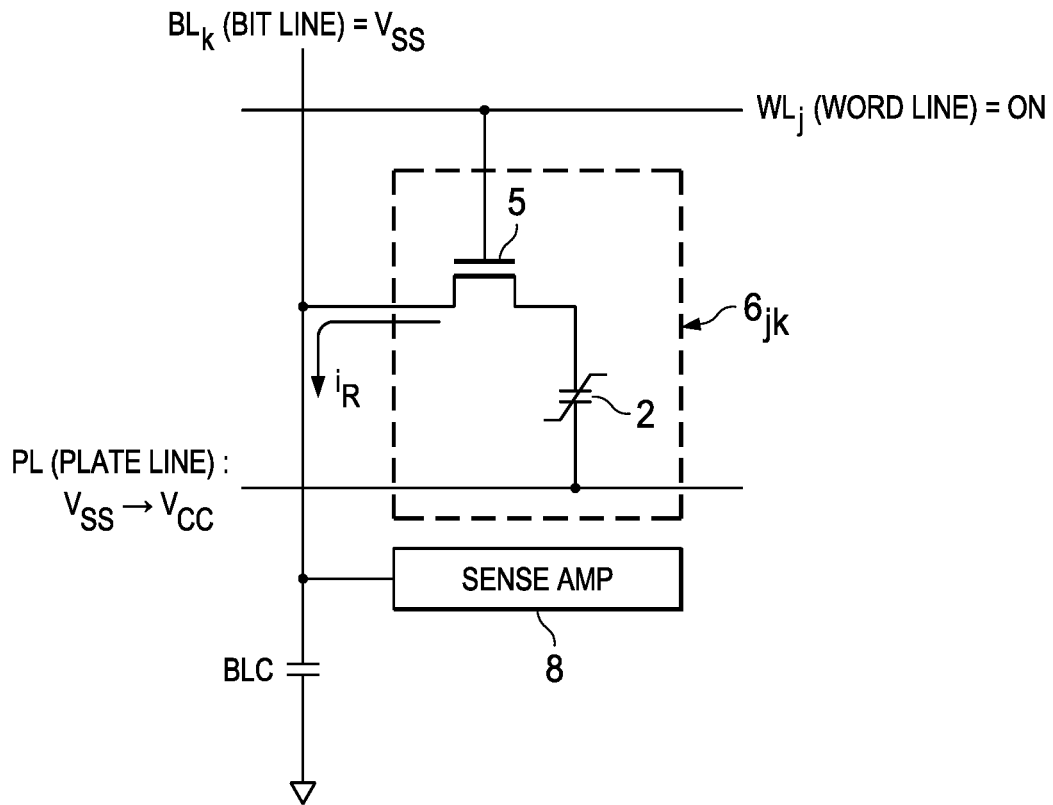
FIG. 1c is an electrical diagrams, in schematic and block form, illustrating a conventional 1T-1C ferroelectric memory cell.
Figure 1D:
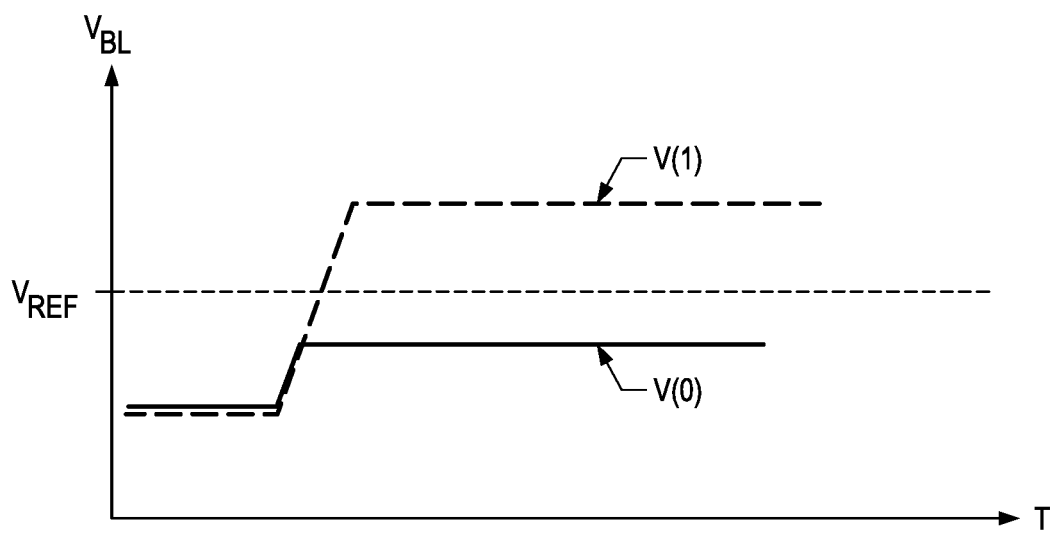
FIG. 1d is a timing diagram illustrating the operation of a read of the 1T-1C ferroelectric memory cell of FIG. 1c.

The one or more embodiments described in this specification are implemented into integrated circuits with ferroelectric memories such as ferroelectric random access memories (FRAMs), as it is contemplated that such implementation is particularly advantageous in that context. However, it is also contemplated that concepts of this invention may be beneficially applied to in other applications, for example integrated circuits with other types of ferroelectric structures and devices. Accordingly, it is to be understood that the following description is provided by way of example only, and is not intended to limit the true scope of this invention as claimed.

It is known in the art that cured polyimide adheres well to the surface of an integrated circuit, and that such adhesion is important in the ability of the polyimide film to serve as a stress relief agent for the integrated circuit when packaged, for example in a molded plastic package. As mentioned above in connection with the Background of the Invention, however, the application of a stress relief film of polyimide or other materials that require curing or anneal is strongly discouraged for integrated circuits that include ferroelectric devices, because the time and temperature required for curing the stress relief film significantly degrade the polarization characteristics of the ferroelectric material. For a specific example, the typical curing process for a polyimide stress relief film is a bake at 375° C. for on the order of one hour, which is essentially fatal to the polarization characteristics of lead-zirconium-titanate (PZT) ferroelectric material. It is believed that this degradation results from the diffusion of hydrogen into the ferroelectric film, such diffusion accelerated by the time and temperature required to cure polyimide in the conventional manner. Accordingly, conventional ferroelectric devices are typically packaged without use of a polyimide stress relief film. This inability to use polyimide with ferroelectric integrated circuits essentially renders impossible the use of wafer-chip-scale package (WCSP) technology for ferroelectric devices, as one or more polyimide passivation films are necessary to form the solder balls and redistribution conductor layers in such packages.

However, it has been observed, in connection with this invention, that polyimide film, when cured, exhibits an intrinsic tensile stress. It has been further observed, also in connection with this invention, that because of the excellent adhesion of cured polyimide to the surface of an integrated circuit, the intrinsic tensile stress in the cured polyimide film exerts a compressive stress on thin film layers in the underlying integrated circuit to such an extent that the polarization characteristics of the ferroelectric material are enhanced. According to this invention, an approach has been discovered for curing a passivation film, such as polyimide, at the surface of a ferroelectric integrated circuit such that the intrinsic tensile stress in the cured passivation film imparts beneficial compressive stress in underlying ferroelectric material, without degrading the polarization of that ferroelectric material due to hydrogen diffusion or other time-and-temperature polarization degradation mechanisms. Embodiments incorporating this discovery will now be described in detail.

Figure 2:
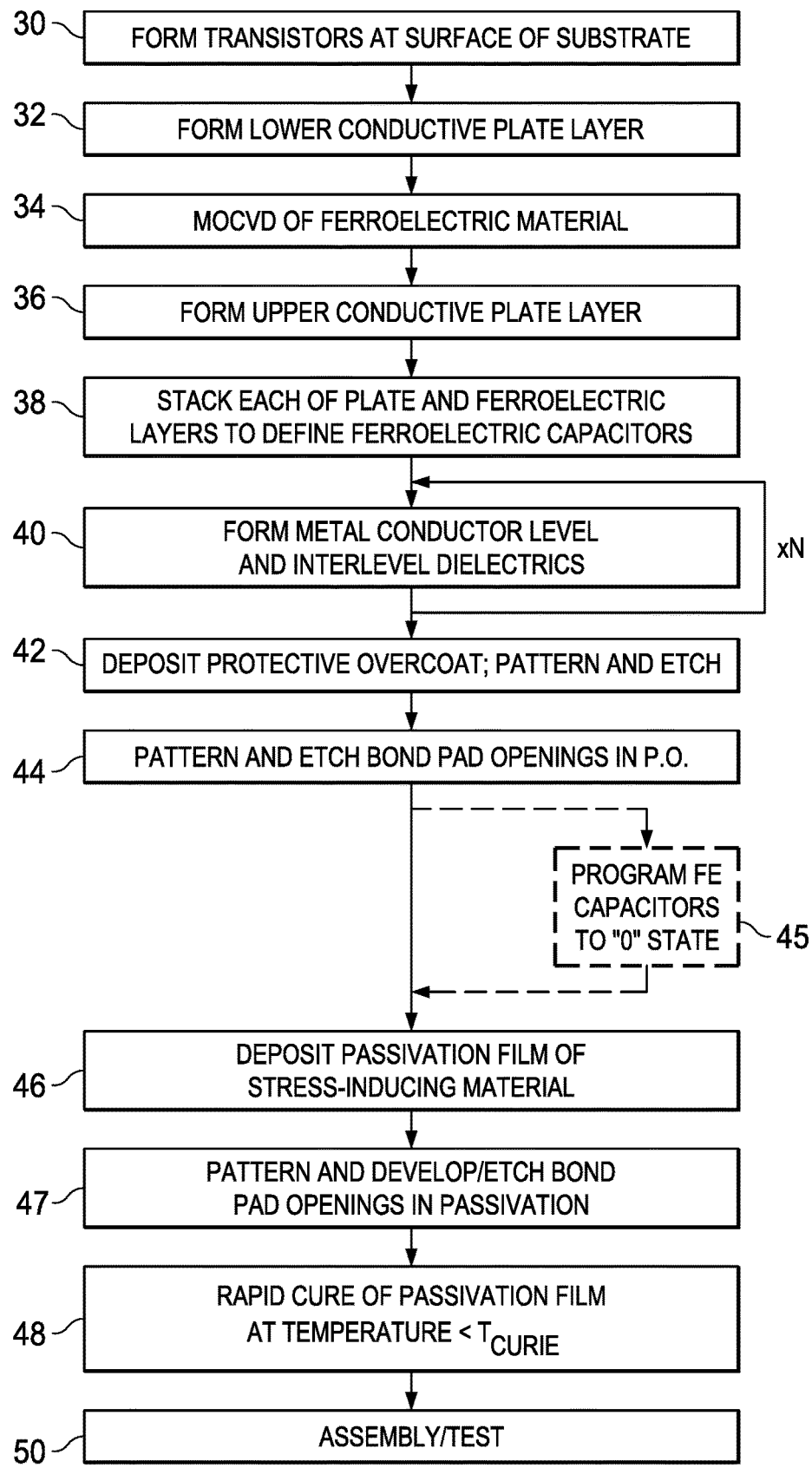
FIG. 2 is a flow diagram illustrating the process flow for manufacturing ferroelectric integrated circuit according to an embodiment.

FIG. 2 illustrates a process flow, according to certain embodiments, for fabricating an integrated circuit with ferroelectric circuit elements, such as ferroelectric capacitors in the form described above relative to FIGS. 1a through 1d, such that the polarization characteristics of the ferroelectric material are enhanced. This process flow begins with process 30, in which transistors such as transistor 5 of FIG. 1a are formed at or near the semiconducting surface of a substrate or other support body in the conventional manner. In particular, it is contemplated that the substrate may correspond to single-crystal silicon with the appropriate dopant concentration, along with such structures as isolation dielectric structures and the appropriate doped wells as desired; alternatively, in the silicon-on-insulator context, it is contemplated that the substrate may correspond to a "handle" wafer on which an insulating layer is formed, with the transistors and other circuit elements formed in an overlying epitaxial silicon layer. In either case, such structures and features as a gate dielectric layer, gate electrodes, source/drain regions, and the like, are formed at or near the surface of the substrate according to conventional MOS processes. In the CMOS context, these transistors may include both p-channel MOS and n-channel MOS transistors. Other circuit elements such as MOS capacitors, resistors, and the like may also be fabricated in this process 30, with interlevel dielectric layers formed and contact openings formed through such layers as appropriate for the particular circuit layout.

Following process 30 in the process flow of FIG. 2, a ferroelectric capacitor such as capacitor 2 of FIG. 1a is then formed, beginning with process 32 in which one or more conductive layers are formed to serve as the lower conductive plate layer. Typically, process 32 will be performed by sputter deposition of one or more layers of the desired conductive material, such as one or more of strontium ruthenate ($SrRuO_3$), iridium (Ir), iridium oxide ($IrO_2$), platinum (Pt), and other metals and metal oxides suitable for use in this application, along with the appropriate barrier metal layers disposed between the lower conductive plate layer and underlying structures, as conventional in the art. In many implementations, the particular conductors deposited in process 32 are selected for compatibility with the ferroelectric material to be deposited over this layer, and with the temperatures and other conditions that the structure will be exposed to in the remainder of the manufacturing process. Following the deposition of the lower conductive plate layer in process 32, ferroelectric material such as lead-zirconium-titanate (PZT) is deposited overall by way of metalorganic chemical vapor deposition, in process 34. Examples of deposition processes suitable for use in process 34 according to this embodiment are described in U.S. Pat. Nos. 6,730, 354, and 8,962,350, both commonly assigned herewith and incorporated herein by reference, Upon completion of PZT deposition process 34, an upper conductive plate layer is then deposited over the ferroelectric material in process 36, for example by way of sputter deposition. It is contemplated that the composition of this upper conductive plate layer will typically be the same as that of lower conductive plate layer, for symmetry and to allow the use of the same materials and processes for each. If lower and upper conductive plate layers are composed of a stack of multiple conductive materials, the order of deposition of those materials in the upper plate layer will typically be reversed from that for the lower plate layer. In process 38, the ferroelectric capacitor is then completed by photolithographic patterning of photoresist or another mask layer to define its size and location, followed by a single masked stack etch of the upper and lower conductive plate layers and the ferroelectric material between those layers. Commonly assigned U.S. Pat. No. 6,656,748, incorporated herein by reference, describes an example of ferroelectric stack formation and etch that is suitable for use as process 38 in connection with embodiments of this invention. Also in process 38, a ferroelectric passivation film may optionally be formed over the etched capacitor structure, such as described in U.S. Patent Publication No. 2013/0056811, published Mar. 7, 2013, commonly assigned herewith and incorporated herein by this reference.

In process 40, conventional processes for forming one or more levels of metal conductors are then performed to define interconnections among the various circuit elements in the integrated circuit being formed. As typical in the art, process 40 for a given level of interconnection will include the deposition of a interlevel dielectric layer, a patterned etch of that interlevel dielectric layer to form vias and contacts to underlying conductors, deposition of conductive material including at least a layer of a metal conductor and perhaps conductive plugs to fill vias through the interlevel dielectric, and a patterned etch of the metal layer to define the routing of the metal conductors in that level. Process 40 is repeated as desired to form additional conductor levels; integrated circuits with six or seven metal levels are common in the art.

The particular material of the metal layer or layers deposited and patterned in process 40 may be aluminum, copper, other conventional metals, or alloys and other combinations of these metals, as known in the art. As known in the art, copper metallization typically requires the use of an underlying barrier layer, typically silicon nitride, to limit the diffusion of copper into the underlying transistors. However, also as known in the art, silicon nitride tends to contain a relatively high concentration of hydrogen, which may diffuse into and thus degrade the ferroelectric material as a result of subsequent thermal processes. Aluminum metallization typically contains less hydrogen, and is thus believed to be more compatible with ferroelectric integrated circuits. But as will become apparent from this description, the described embodiments enable the use of copper metallization even with a silicon nitride barrier layer, while avoiding degradation in the polarization characteristics of the ferroelectric material.

Following process 40, a protective overcoat layer, typically composed of silicon nitride or silicon oxynitride, is deposited overall in process 42. In process 44, photolithographic patterning and etching of the protective overcoat is then performed to form openings over the bond pads in the upper metal level, in the conventional manner.

According to this embodiment, a passivation film is then deposited over the surface of the integrated circuit in process 46. The composition of this passivation film is of a material that attains a stress state when cured in the manner to be described below according to this embodiment, such that the stress state of the cured passivation film exerts a stress on the underlying ferroelectric circuit elements in the integrated circuit. An example of such a passivation film is a polyimide, such as the HD4100 polyimide product available from RD MicroSystems. Other materials suitable for use as the passivation film include polybenzoxazole (PBO)), benzocyclobutene-based polymers (BCB), fluoro-polymers, and other polymer-containing soft stress release materials having a low elastic modulus as compared with $SiO_2$. Process 46 may be performed in the conventional manner for the selected passivation film material, for example by spinning on or otherwise dispensing the passivation film material onto the surface of the wafer, to a thickness on the order of several micrometers. An example of a passivation film dispensed in process 44 according to this embodiment is a 10 µm layer of the HD4100 polyimide.

In process 47, selected locations of the passivation film deposited in process 44 is photolithographically removed, for example to expose the bond pads previously exposed by the etch of the underlying protective overcoat in process 42. If the passivation film is a photosensitive polyimide or similar film, the bond pad openings and other selected locations of the film will be removed in process 47 by masked exposure and developing of the film as appropriate for the particular material. If the passivation film requires chemical etching, process 47 will involve conventional photolithographic pattern and etch processes. According to this alternative, it is contemplated that the previous protective overcoat etch of process 42 may in some cases be omitted from the process flow, with process 47 then including both an etch of the passivation film and an etch of the underlying protective overcoat to expose the bond pads in the upper metal level.

Process 48 is then performed to cure the passivation film deposited in process 44. In a general sense, cure process 48 is performed by heating the wafer including the integrated circuit being fabricated, with the passivation film deposited in process 44, to a selected cure temperature for a selected time duration at that cure temperature. According to these embodiments, the time and temperature conditions of cure process 48 are selected so as to cure the passivation film into a state in which it exhibits an intrinsic tensile stress sufficient to impart a compressive stress in underlying ferroelectric material, without degrading the polarization of that ferroelectric material due to hydrogen diffusion or other time-and-temperature polarization degradation mechanisms. It is contemplated that the range of conditions of cure process 48 will depend, at least in part, on the specific materials used for the ferroelectric material and the passivation film.

However, certain general limits for the time and temperature conditions of cure process 48 have been discovered in connection with these embodiments. As known in the art, ferroelectric material exhibits a "Curie temperature", which is defined as the temperature at which, absent an externally applied electric field, the crystal structure of the ferroelectric material undergoes a phase change that causes loss of polarization. While the depolarized material will repolarize on application of a coercive voltage, it is believed that repeated or extended exposure of the ferroelectric material to temperatures above the Curie temperature will result in some permanent degradation in its polarization characteristics. As such, cure process 48 in this embodiment is carried out at a cure temperature below the Curie temperature of the ferroelectric material deposited in process 34. This cure temperature is contemplated to be the temperature measured at the wafer, for example by way of a non-contact IR pyrometer.

Secondly, as noted above, the duration of high temperature exposure of the ferroelectric material is a significant factor in the degradation of its polarization characteristics. Accordingly, cure process 48 in this embodiment is performed by minimizing the time at which the cure temperature is maintained, and by maximizing the ramp rate at which the wafer is heated to the cure temperature and then cooled from the cure temperature, so as to minimize the overall exposure of the ferroelectric material to high temperatures in cure process 48.

An example of cure process 48 that has been observed, by experiment, to enhance the polarization characteristics of PZT ferroelectric material, is carried out by way of electromagnetic heating. In this embodiment, the electromagnetic heating of process 48 involves the application of electromagnetic energy to the passivation film at a frequency that couples to the vibrational frequency of the polymer of the passivation film, which heats and cures the film. One type of electromagnetic heating that has been observed to be suitable for cure process 48 is microwave heating, such as may be applied by a variable frequency microwave system in which the frequency of the electromagnetic wave can be selected (e.g., over a range from about 5 GHz to about 9 GHz) so as to efficiently couple to the polymer of the particular passivation film. As known in the art (for example as described in U.S. Pat. No. 7,939,456, incorporated herein by reference), variable frequency microwave heating is typically performed by selecting a center frequency for the microwave energy, and then rapidly and substantially continuously sweeping the frequency over a frequency range about that center frequency, for example over a range of ±5% about the center frequency, although this range may vary based on the particular equipment used. In this example of cure process 48, the wafer or wafers including integrated circuits with ferroelectric circuit elements fabricated as described above, including a passivation film of HD4100 polyimide at a thickness of about 10 µm, are placed into the vacuum chamber of a variable frequency microwave system and heated by the application of microwave energy at a center frequency of about 6.25 GHz, modulated over a range of about ±6.25%_(0.4 GHz). This variable frequency microwave energy heats the wafer to a cure temperature, measured at the wafer, of at least about 340° C. and at or below about 390° C. (400° C. being the Curie temperature of the deposited PZT in this example), for example at about 360° C., for less than twenty minutes, for example for about five to ten minutes.

The use of electromagnetic heating to carry out cure process 48 is contemplated to be especially beneficial in connection with these embodiments, considering that the electromagnetic energy can couple to the organic molecules of the polyimide passivation film (and similarly to other organic materials as used for the passivation film) much more strongly than it can to the inorganic molecules of the underlying integrated circuit, including the ferroelectric material. Accordingly, this difference in coupling efficiently heats the passivation film to carry out the curing mechanism, while minimizing the energy delivered to the ferroelectric material. As such, the use of electromagnetic heating operates to control the thermal exposure of the device in cure process 48, but does not directly impact the performance of the ferroelectric material. In fact, it is contemplated that the only heating of the ferroelectric material caused by electromagnetic curing used in process 48 will be heat conducted from the passivation film to the ferroelectric material through the intervening layers therebetween. Accordingly, it is contemplated that the electromagnetic heating of the passivation film is well-suited to curing that film in the minimum time, so as to minimize temperature exposure of the underlying ferroelectric material.

Variable frequency microwave is believed to be a particularly useful type of electromagnetic heating for use in curing process 48. As known in the art, for example as described in the above-incorporated U.S. Pat. No. 7,939,456, variable frequency microwave heating in the processing of semiconductor wafers avoids damaging arc formation, and also provides more uniform heating over the wafer. This more uniform heating provided by variable frequency microwave energy is believed to significantly improve the curing of the passivation film in process 48 in this embodiment, enabling shorter cure times and thus reducing the degradation of the underlying ferroelectric material by exposure to the elevated curing temperature.

The heating of the wafer from ambient temperature to the cure temperature, as measured by a non-contact IR pyrometer directed at the wafer surface (i.e., the polyimide passivation film) to the cure temperature is carried out in this example at a ramp rate of at least 0.40° C. per second, for example at 0.60° C. per second. The ramp rate at which the wafer returns to the ambient temperature from the cure temperature should also be maximized, in this embodiment, with a desirable ramp rate being at least 0.40° C. per second, for example at 0.60° C. per second. It is contemplated that heating and cooling ramp rates resembling a "step function" would be desirable, to the extent attainable in physical systems, considering that the extent of the curing mechanism from the temperatures below the eventual cure temperature are expected to be insignificant while the degrading effects on the ferroelectric material of the temperature exposure in those ramp periods will be cumulative. In this regard, it is contemplated that use of a smaller capacity variable frequency microwave system, such as a single-wafer system, in curing process 48 may further reduce degradation of the ferroelectric material, as such smaller systems will tend to have shorter cool-down times than larger batch systems.

It is contemplated that other approaches to curing the passivation film in process 48 may alternatively be used. For example, it is contemplated that rapid thermal anneal (RTA) may be a suitable technology for cure process 48. In this regard, it is contemplated that relatively simple modifications to the configuration of conventional RTA systems will enable their use in cure process 48 according to these embodiments. Other approaches to cure process 48 that limit the time at the cure temperature while sufficiently curing the passivation film are also contemplated.

Figure 3:
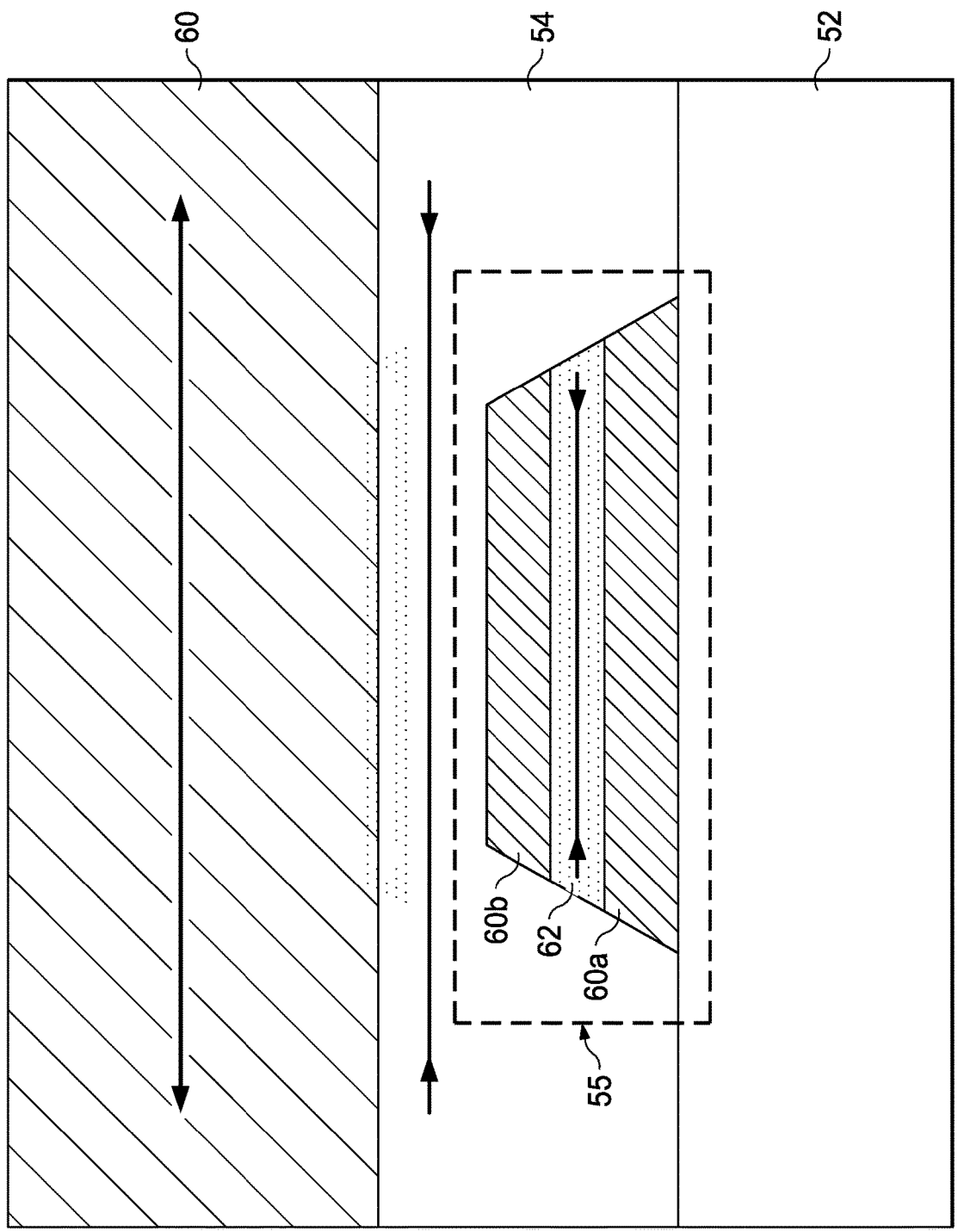
FIG. 3 is a cross-sectional view, in schematic form, of a portion of an integrated circuit fabricated according to the embodiment of FIG. 2, and illustrating the effect of an overlying passivation film on a ferroelectric structure.

FIG. 3 schematically illustrates the result of passivation film deposition process 44 and cure process 48 on the underlying ferroelectric structures. In this example, ferroelectric capacitor 55 has been formed at or near the surface of substrate 52, and includes lower and upper plates 60a, 60b on either side of ferroelectric material 62. Dielectric material 54 is disposed over and around lower and upper plates 60a, 60b and ferroelectric material 62, and includes the various interlevel dielectric layers that insulate the metal levels (not shown) in the integrated circuit, as well as the protective overcoat layer deposited in process 42. In this schematic view of FIG. 3, polyimide passivation film 60 is disposed over dielectric material 54.

As evident by the force arrows shown in FIG. 3, upon curing of polyimide passivation film 60 in cure process 48 according to these embodiments, passivation film 60 exhibits an intrinsic tensile stress. Because of the excellent adhesion of polyimide passivation film 60 to the surface of dielectric material 54, as is typical in conventional integrated circuits, this tensile stress state of passivation film 60 imparts a compressive stress on the underlying dielectric material 54. This compressive stress on dielectric material 54 will be transferred also to ferroelectric material 62, as evident by the force arrow shown in FIG. 3 for that layer. This compressive stress has been observed to improve the polarization performance of ferroelectric material 62.

Referring back to FIG. 2, programming process 45 may optionally be performed prior to cure process 48. For example, as shown in FIG. 2, programming process 47 is performed after access to the bond pads or other terminals of the integrated circuit is provided by way of the patterned etch of the protective overcoat in process 46, prior to deposition of the passivation film. It has been observed, in connection with some embodiments, that the enhancement in the polarization characteristics of ferroelectric circuit elements resulting from the compressive stress imparted to the ferroelectric material by the cured passivation film, as discussed above relative to FIG. 3, is further enhanced in those cases in which the ferroelectric material is programmed (i.e., polarized) prior to cure process 48. Accordingly, programming process 47 is performed by the application of a voltage to each of the ferroelectric structures in the integrated circuit that is at or above the coercive voltage for those ferroelectric structures. Typically, it is contemplated that this programming process 47 will be performed using conventional automated test equipment, for example at the time that the wafer containing the integrated circuits is electrically tested following its fabrication (e.g., at any time after protective overcoat process 42 and prior to cure process 48).

It has also been observed, in connection with some of these embodiments, that the polarity of the polarization applied in programming process 47 can affect the enhancement effect of the applied compressive stress on the ferroelectric material. For the example of ferroelectric capacitors that are electrically arranged similarly as the ferroelectric memory cell described above relative to FIGS. 1a through 1c, it has been observed that the polarization enhancement is increased by programming process 47 programming a "0" data state on the ferroelectric capacitor, as compared with process 47 programming a "1" data state. More specifically, in the arrangement of FIGS. 1a through 1d in which a positive plate line voltage is applied to upper conductive plate 20b of FIG. 1a, the "0" data state (i.e., the state exhibiting the V(0) transition in FIG. 1d) corresponds to the "+1" polarization state in the hysteresis diagram of FIG. 1b. In general, this preferred polarization state programmed in process 47 is that for which the ferroelectric material is not polarized to the opposite state by the application of the read voltage.

While a preferred polarization state (e.g., the "0" data state) for programming process 47 may be exhibited by the ferroelectric structures, the less preferred polarization state (in this example, the "1" data state) may still exhibit some additional enhancement as compared with that resulting from cure process 48 for unpolarized (or "native") ferroelectric material. However, as noted above, significant enhancement in the polarization characteristics of the ferroelectric material is still attained even without the additional benefit of the pre-polarization of the ferroelectric material. As such, programming process 47 is optional according to this embodiment.

Following cure process 48, assembly and test process 50 is then performed on the integrated circuits in the conventional manner. As known in the art, assembly/test process 50 includes such assembly operations as the dicing of integrated circuits from wafer form, mounting of the individual dies to a lead frame or other package, wire bonding or other bonding to electrically connect the bond pads of the integrated circuit to leads of the eventual package, and completion of the package by molding (and curing) plastic mold compound around the lead frame and die or otherwise sealing the package, depending on the particular plastic or ceramic packaging technology being used. Electrical test of the packaged integrated circuit is then also performed as part of assembly/test process 50, including the exercise of the ferroelectric structures in those integrated circuits as appropriate for the desired device functionality. Assembly/test process 50 may also include the mounting of the packaged integrated circuit to a printed circuit board or other system implementation, such as by way of solder reflow or wave soldering, whether performed by the manufacturer of the integrated circuit or by a customer or other end user.

According to some embodiments, as mentioned above, these embodiments enable the packaging of ferroelectric integrated circuits in packages of the type referred to in the art as wafer-chip-scale packages (WCSP). These packages are essentially at the size of the die itself, and rely on solder balls that are separated from the integrated circuit surface by polyimide or other passivation layers. And as mentioned above, the degradation of polarization characteristics resulting from conventional cure processes for these passivation layers has effectively precluded the use of WCSP technology for ferroelectric devices. However, the enhanced polarization performance, and the resulting improved read margin for FRAM devices in particular, as provided by the passivation cure processes implemented according to these embodiments, has enabled the use of WCSP technology for FRAMs and other ferroelectric devices.

Figure 4:
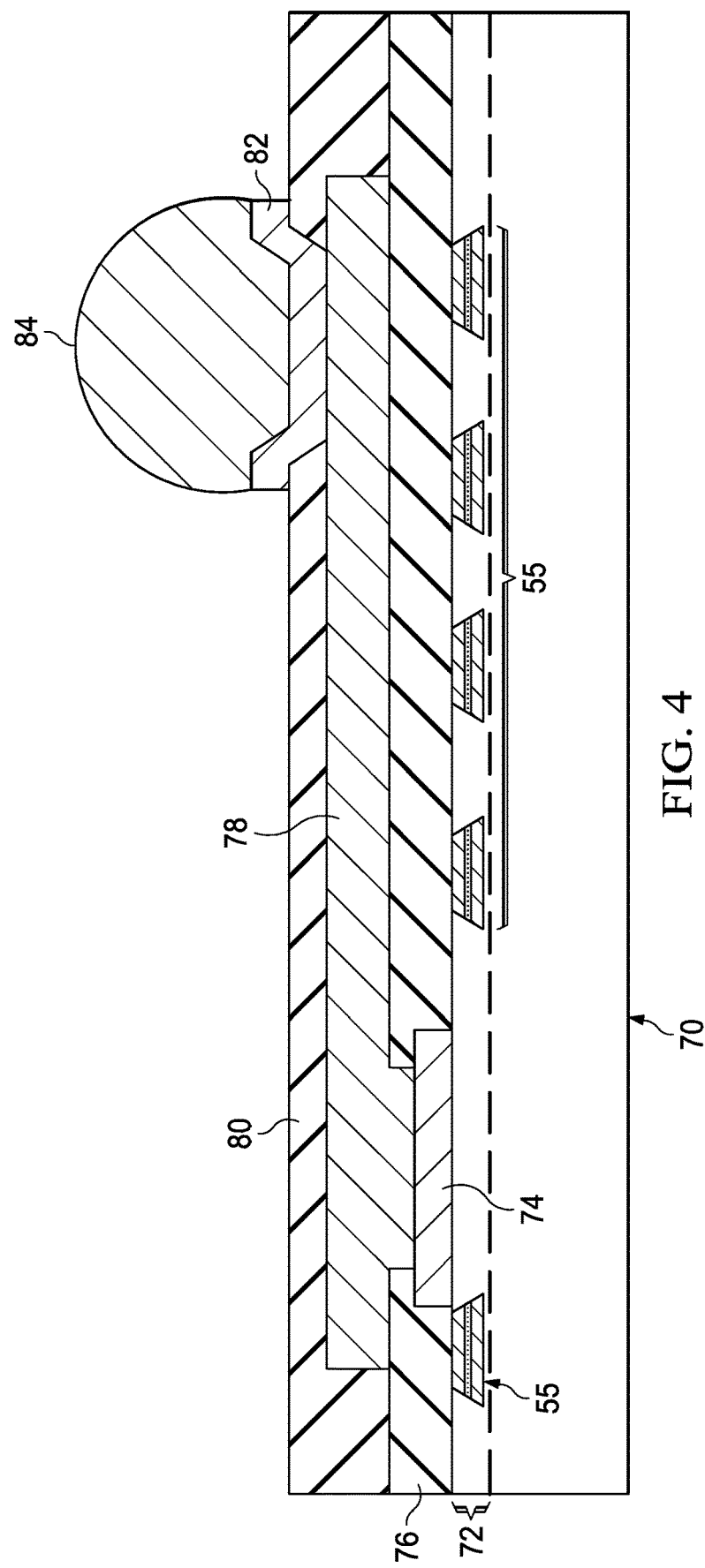
FIG. 4 is a cross-sectional view, in schematic form, of a portion of an integrated circuit fabricated according to the embodiment of FIG. 2 as packaged in a wafer-chip-scale package.

FIG. 4 illustrates, in cross-section, a ferroelectric integrated circuit packaged in a WCSP package according to an embodiment. In this example, integrated circuit die 70 has its circuit components 72 formed at and near the semiconducting surface of its substrate, as described above in connection with the process flow of FIG. 2. As suggested generally in FIG. 4, these circuit components 72 include ferroelectric capacitors 55. Conductive pad 74 corresponds to a bond pad at the surface of die 70, and is electrically coupled with the active circuitry 72. First passivation layer 76 is a layer of a polyimide or other suitable passivation material that has been dispensed onto the surface of die 70, and patterned to expose a portion of pad 74 as shown. According to this embodiment, cure process 48 cures passivation layer 76 by heating the structure to a cure temperature below the Curie temperature of the ferroelectric material in capacitors 55, for a duration sufficient for passivation layer 76 to attain a tensile stress state but not so long as to significantly degrade the polarization characteristics of the ferroelectric material, as described above.

Redistribution layer (RDL) 78 is a conductive layer deposited and patterned at the surface of first passivation layer to electrically couple with pad 74. RDL layer 78 as patterned extends over the surface of first passivation layer 76 from pad 74 to a location at which external electrical contact is to be formed. In this example, second passivation layer 80, which is also of a polyimide or other suitable passivation material, is dispensed onto the surface of first passivation layer 76 and RDL layer 80, cured by way of cure process 48, and patterned to expose RDL 18 at a selected location. It is contemplated that the stress exerted by second passivation layer 80 onto the ferroelectric material of capacitors 55 will be attenuated considering that it is in indirect contact only with the surface of die 70 (i.e., via first passivation layer 76). As such, the duration of the second instance of cure process 48 performed for second passivation layer 80 need only be of such a duration as to attain structural integrity. Alternatively, it is contemplated that passivation layers 76, 80 may both be dispensed and patterned prior to cure, such that a single instance of cure process 48 may be performed to place both layers into a tensile stress state that imparts compressive stress to the ferroelectric material of capacitors 55, without degrading the polarization characteristics of that material as described above.

The WCSP package of FIG. 3 is completed by the deposition and patterning of a conductive metal layer to form under bump metallization ("UBM") pad 82 at the location of the opening through second passivation layer 80 at which RDL 78 is exposed. Solder ball 84 is then formed at UBM pad 82, in the conventional manner. As known in the art, UBM layer 82 protects the exposed edges of second passivation layer 80 from delamination of second passivation layer 80 from the underlying RDL 78, which would provide a path for contamination and, in some situations, short circuits among elements of RDL 78. UBM 82 can also serve as a diffusion barrier to the material of solder ball 84.

Alternatively, as known in the art, if solder ball 84 can be formed over pad 74 at the surface of die 70, only a single passivation layer 76 (and single instance of cure process 48) would be necessary.

In any event, the dispensing and curing of passivation layers such as polyimide in the WCSP context, as described above relative to FIG. 4 according to these embodiments, can enhance rather than degrade the polarization characteristics of ferroelectric material in circuit elements of the packaged integrated circuit die. As known in the art, most if not all ferroelectric dielectric materials also exhibit a piezoelectric effect such that the ferroelectric characteristics of the material can be altered by applied stresses. It is contemplated that some combination of the stress applied by the cured passivation layer, the heat of the curing process, and the electric field within the ferroelectric capacitor permanently and physically reorients domains in the ferroelectric material in parallel with that electric field, and that this realignment of the domains enhances the polarization characteristics of the ferroelectric material, increasing the signal margin of the device. In addition, because the curing of these passivation layers according to these embodiments is carried out in a way that does not significantly degrade the polarization characteristics of the ferroelectric material, the ferroelectric material is better able to tolerate the temperature exposure involved in the solder reflow involved in the mounting of the WCSP package to a printed circuit board. Indeed, it is believed that these embodiments enable ferroelectric integrated circuits to be packaged as WCSPs, which was not previously practicable due to the polarization degradation caused by the conventional polyimide cure and solder reflow processes.

It is therefore contemplated that the enhancement of the polarization characteristics of ferroelectric materials provided by these embodiments can provide significant benefit to integrated circuits with ferroelectric materials. For example, the improved read margin provided by these embodiments enables the manufacture of FRAMs suitable for reliable use in a wider range of applications, such as in systems intended for elevated temperatures. In addition, these embodiments improve the tolerance of the ferroelectric integrated circuits for high temperature processes such as WCSP packaging, solder reflow and other mounting processes, without necessitating relaxation of the expected electrical performance and reliability specifications (e.g., circuit performance, device sizes, etc.) from what may otherwise be attainable for applicable technology node. And if instead the ferroelectric integrated circuits are packaged in conventional molded plastic packages, the benefits of using polyimide as a stress relief agent are obtained without suffering the degradation in polarization characteristics encountered from conventional cure processing. In addition, these embodiments can enable the use of copper metallization and the resulting increased conductivity in the metal conductors relative to aluminum and other materials, despite the high hydrogen concentration in the silicon nitride barrier layer typically used with copper, because of the minimal thermal processing involved in curing the passivation layer as described above.

While one or more embodiments have been described in this specification, it is of course contemplated that modifications of, and alternatives to, these embodiments, such modifications and alternatives capable of obtaining one or more of the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of manufacturing an integrated circuit, comprising:
    forming at least one circuit element comprising a layer of a ferroelectric material near a semiconducting surface of a body;
    then forming at least one level of conductors overlying the at least one circuit element, each level comprising patterned metal conductors and a dielectric layer;
    forming a protective overcoat layer over the semiconducting surface and overlying the at least one circuit element and the at least one level of conductors;
    then depositing a passivation layer of a material comprising a polymer-containing film over the protective overcoat layer; and
    applying electromagnetic energy to the passivation layer at a vibrational frequency of the polymer of the polymer-containing film, to heat the passivation layer to a temperature below a Curie temperature of the ferroelectric material for a duration sufficient to cure the material of the passivation layer into a tensile stress state, wherein applying the electromagnetic energy heats the polymer-containing film from an ambient temperature at a rate of at least 0.4° C./sec to a cure temperature of the polymer-containing film.

2. The method of claim 1, wherein the step of applying electromagnetic energy is performed for a duration of less than about twenty minutes.

3. The method of claim 1, wherein the step of applying electromagnetic energy heats the polymer-containing film from the ambient temperature at a rate of at least 0.6° C./sec to the cure temperature of the polymer-containing film.

4. The method of claim 1, further comprising after applying the electromagnetic energy, cooling the polymer-containing film from the cure temperature at a rate of at least −0.4° C./sec to the ambient temperature.

5. The method of claim 4, further comprising after applying the electromagnetic energy, cooling the polymer-containing film from the cure temperature at a rate of about −0.6° C./sec to the ambient temperature.

6. The method of claim 1, wherein the electromagnetic energy is applied in the form of variable-frequency microwaves having a frequency in a range from 5 GHz to 9 GHz.

7. The method of claim 1, wherein the ferroelectric material comprises lead-zirconium-titanate (PZT) or strontium-bismuth-tantalate (SBT).

8. The method of claim 1, wherein the polymer-containing film comprises polyimide.

9. A method of manufacturing an integrated circuit, comprising:
    forming at least one circuit element comprising a layer of a ferroelectric material over a semiconducting surface of a substrate;
    then forming at least one interconnect level overlying the at least one circuit element, the at least one interconnect level comprising patterned metal conductors and a dielectric layer;
    forming a protective overcoat layer over the at least one circuit element and the at least one interconnect level;
    then depositing a layer of a polymer-containing film over the protective overcoat layer; and
    heating the substrate from an ambient temperature at a rate of at least 0.4° C./sec to a cure temperature of the polymer-containing film.

10. The method of claim 9, wherein the heating is performed by a rapid thermal anneal (RTA) process.

11. The method of claim 9, wherein the heating is performed by microwave heating.

12. The method of claim 9, wherein the substrate is cooled from the cure temperature to the ambient temperature at a rate of at least −0.4° C./min.

13. The method of claim 9, wherein the cure temperature is below a Curie temperature of the ferroelectric material.

14. The method of claim 9, wherein the substrate is maintained at the cure temperature for a cure time less than 20 min.

15. The method of claim 14, wherein the cure time is in a range from five minutes to ten minutes.

16. A method of manufacturing an integrated circuit, comprising:
    forming a ferroelectric capacitor over a semiconductor substrate, the ferroelectric capacitor including a ferroelectric material layer;
    forming a dielectric layer over the ferroelectric capacitor;
    forming a polymer-containing film on the dielectric layer; and
    heating the polymer-containing film from an ambient temperature to a cure temperature at a rate of at least 0.4° C./sec and cooling the polymer-containing film from the cure temperature to the ambient temperature a rate of at least −0.4° C./sec.

17. The method of claim 16, wherein the cure temperature is below a Curie temperature of the ferroelectric material of the ferroelectric material layer.

18. The method of claim 16, wherein the substrate is maintained at the cure temperature for a duration in a range from five minutes to ten minutes.

19. The method of claim 16, wherein the polymer-containing film is heated at a rate of at least 0.6° C./sec and cooled at a rate of at least −0.6° C./sec.

20. The method of claim 16, wherein the ferroelectric material layer comprises lead-zirconium-tantalate (PZT).

* * * * *